US012173934B2

(12) United States Patent
Sercel et al.

(10) Patent No.: US 12,173,934 B2
(45) Date of Patent: *Dec. 24, 2024

(54) SYSTEMS AND METHODS FOR OBTAINING ENERGY IN SHADOWED REGIONS

(71) Applicant: Trans Astronautica Corporation, Lake View Terrace, CA (US)

(72) Inventors: Joel C. Sercel, Lake View Terrace, CA (US); Craig Peterson, Los Angeles, CA (US); Anthony Longman, Woodland Park, CO (US)

(73) Assignee: Trans Astronautica Corporation, Lake View Terrace, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 17/205,610

(22) Filed: Mar. 18, 2021

(65) Prior Publication Data

US 2021/0333019 A1 Oct. 28, 2021

Related U.S. Application Data

(63) Continuation of application No. 16/828,912, filed on Mar. 24, 2020, now Pat. No. 10,989,443.

(Continued)

(51) Int. Cl.
*F24S 23/70* (2018.01)
*F24S 20/20* (2018.01)
(Continued)

(52) U.S. Cl.
CPC ............... *F24S 23/70* (2018.05); *F24S 20/20* (2018.05); *F24S 20/60* (2018.05); *F24S 50/20* (2018.05);
(Continued)

(58) Field of Classification Search
CPC .. F24S 20/20; F24S 20/60; F24S 23/70; F24S 25/00; F24S 50/20; F24S 2020/23;
(Continued)

(56) References Cited

U.S. PATENT DOCUMENTS 1,964,189 A 6/1934 Koomans
2,930,187 A 3/1960 Chillson
(Continued)

FOREIGN PATENT DOCUMENTS

AU 2007200666 A1 8/2007
CN 103075816 5/2013
(Continued)

OTHER PUBLICATIONS

Arnold, J.R., "Ice in the lunar polar regions", J. Geophys. Res 84., 1979, pp. 5659-5668.

(Continued)

*Primary Examiner* — Ricky D Shafer
(74) *Attorney, Agent, or Firm* — Knobbe, Martens, Olson & Bear, LLP

(57) ABSTRACT

Systems and methods are disclosed for directing radiant energy to permanently shadowed or occasionally shadowed regions such as on the floors of craters or in valleys in lunar polar regions to provide illumination, thermal power, electricity, communications, and other services. Embodiments of the systems include reflector elements to provide diffuse illumination, focused illumination, and thermal power, structures to support the reflectors and other elements, communications devices for varied signal types, and methods for installing the system. The structure can be compactly folded and delivered to be automatically installed.

19 Claims, 8 Drawing Sheets

Related U.S. Application Data

(60) Provisional application No. 62/992,880, filed on Mar. 20, 2020, provisional application No. 62/962,147, filed on Jan. 16, 2020.

(51) Int. Cl.
  *F24S 20/60*    (2018.01)
  *F24S 50/20*    (2018.01)
  *H02S 20/10*    (2014.01)
  *H02S 30/10*    (2014.01)

(52) U.S. Cl.
  CPC .............. *H02S 20/10* (2014.12); *H02S 30/10* (2014.12); *F24S 2020/23* (2018.05); *F24S 2023/872* (2018.05)

(58) Field of Classification Search
  CPC ............. F24S 2023/872; F24S 2025/01; F24S 2025/012; H02S 20/10; H02S 20/32; H02S 30/10; H02S 40/22
  USPC ................ 359/853; 126/600, 684, 688, 696; 136/206, 246, 253; 353/3
  See application file for complete search history.

(56) References Cited

U.S. PATENT DOCUMENTS

| | | | |
|---|---|---|---|
| 2,945,234 A * | 7/1960 | Driscoll | H01Q 15/161 343/915 |
| 2,975,592 A | 3/1961 | Fox | |
| 2,990,836 A | 7/1961 | Bird | |
| 2,991,617 A | 7/1961 | Nerad | |
| 3,063,521 A | 11/1962 | Fuller | |
| 3,064,418 A | 11/1962 | Sanders | |
| 3,202,998 A * | 8/1965 | Hoffman | B64G 99/00 244/158.3 |
| 3,564,253 A | 2/1971 | Buckingham | |
| 3,597,923 A | 8/1971 | Simon | |
| 3,606,211 A | 9/1971 | Roersch et al. | |
| 4,013,885 A | 3/1977 | Blitz | |
| 4,073,138 A | 2/1978 | Beichel | |
| 4,122,239 A | 10/1978 | Riboulet | |
| 4,135,489 A | 1/1979 | Jarvinen | |
| 4,286,581 A | 1/1981 | Atkinson, Jr. | |
| 4,263,895 A | 4/1981 | Colao | |
| 4,449,514 A | 5/1984 | Selcuk | |
| 4,459,972 A | 7/1984 | Moore | |
| 4,480,677 A | 11/1984 | Henson et al. | |
| 4,528,978 A | 7/1985 | Robinson | |
| 4,564,275 A | 1/1986 | Stone | |
| 4,771,599 A | 9/1988 | Brown | |
| 4,771,600 A | 9/1988 | Limerick | |
| 4,781,018 A | 11/1988 | Shoji | |
| 4,815,443 A | 3/1989 | Vrolyk | |
| 4,932,910 A * | 6/1990 | Hayday | B63C 9/21 441/12 |
| 5,014,131 A | 5/1991 | Reed et al. | |
| 5,047,654 A * | 9/1991 | Newman | G03F 7/022 290/52 |
| 5,104,211 A | 5/1992 | Schumacher et al. | |
| 5,114,101 A | 5/1992 | Stern et al. | |
| 5,138,832 A | 8/1992 | Pande | |
| 5,202,541 A | 4/1993 | Patterson | |
| 5,266,762 A | 11/1993 | Hoffman | |
| 5,305,970 A | 4/1994 | Porter et al. | |
| 5,459,996 A | 10/1995 | Malloy, III | |
| 5,511,748 A | 4/1996 | Scott | |
| 5,578,140 A * | 11/1996 | Yogev | F24S 50/20 136/246 |
| 5,593,549 A | 1/1997 | Stirbl et al. | |
| 5,674,794 A | 10/1997 | Chatterjee | |
| 5,751,895 A | 5/1998 | Bridges | |
| 5,861,947 A | 1/1999 | Neumann | |
| 5,979,438 A * | 11/1999 | Nakamura | F24S 23/71 126/685 |
| 5,982,481 A | 11/1999 | Stone | |
| 6,052,987 A | 4/2000 | Dressler | |
| 6,057,505 A | 5/2000 | Ortabasi | |
| 6,193,193 B1 | 2/2001 | Sorrano | |
| 6,290,185 B1 | 9/2001 | DeMars | |
| 6,343,464 B1 | 2/2002 | Westerman | |
| 6,350,973 B2 | 2/2002 | Wroe | |
| 6,532,953 B1 * | 3/2003 | Blackmon | F24S 25/10 126/696 |
| 6,669,148 B2 | 12/2003 | Anderman et al. | |
| 6,742,325 B2 | 6/2004 | Kudija, Jr. | |
| 7,207,327 B2 | 4/2007 | Litwin | |
| 7,387,279 B2 | 6/2008 | Anderman et al. | |
| 7,575,200 B2 | 8/2009 | Behrens et al. | |
| 7,594,530 B2 | 9/2009 | Tucker | |
| 7,823,837 B2 | 11/2010 | Behrens et al. | |
| 7,997,510 B2 | 6/2011 | Pavia et al. | |
| 8,033,110 B2 | 10/2011 | Gilon et al. | |
| 8,147,076 B2 * | 4/2012 | Ezawa | F24S 25/13 353/3 |
| 8,357,884 B1 | 1/2013 | Ethridge | |
| 8,379,310 B2 | 2/2013 | Mori et al. | |
| 9,010,317 B1 | 4/2015 | Gross | |
| 9,187,191 B1 | 11/2015 | Jensen et al. | |
| 9,222,702 B2 | 12/2015 | Goldberg | |
| 9,266,627 B1 | 2/2016 | Anderson | |
| 9,409,658 B1 | 8/2016 | Diamandis et al. | |
| 9,581,021 B2 | 2/2017 | Ethridge | |
| 9,676,499 B2 | 6/2017 | Myers et al. | |
| 9,709,771 B2 | 7/2017 | Corrigan | |
| 9,771,897 B2 | 9/2017 | Soulier | |
| 10,654,596 B1 | 5/2020 | Eller | |
| 10,919,227 B2 | 2/2021 | Cook | |
| 10,989,443 B1 * | 4/2021 | Sercel | F24S 50/20 |
| 11,085,669 B2 | 8/2021 | Sercel | |
| 11,143,026 B2 | 10/2021 | Sercel et al. | |
| 11,280,194 B2 | 3/2022 | Sercel | |
| 11,391,246 B2 | 7/2022 | Sercel et al. | |
| 11,566,521 B2 | 1/2023 | Sercel | |
| 11,598,581 B2 | 3/2023 | Small | |
| 11,608,196 B2 | 3/2023 | Sercel et al. | |
| 11,643,930 B2 | 5/2023 | Sercel | |
| 11,702,857 B2 | 7/2023 | Sercel | |
| 11,725,513 B2 | 8/2023 | Sercel et al. | |
| 2002/0075579 A1 | 6/2002 | Vasylyev et al. | |
| 2002/0184873 A1 | 12/2002 | Dujarric | |
| 2003/0029969 A1 | 2/2003 | Turner | |
| 2003/0173469 A1 | 9/2003 | Kudija et al. | |
| 2003/0224082 A1 | 12/2003 | Akopyan | |
| 2004/0004184 A1 | 1/2004 | Schubert | |
| 2004/0231716 A1 | 11/2004 | Litwin | |
| 2006/0191916 A1 | 8/2006 | Stephan et al. | |
| 2007/0128582 A1 | 6/2007 | Anderson et al. | |
| 2008/0000232 A1 | 1/2008 | Rogers et al. | |
| 2008/0023060 A1 | 1/2008 | Grumazescu | |
| 2008/0134667 A1 | 6/2008 | Pavia et al. | |
| 2008/0156315 A1 | 7/2008 | Yangpichit | |
| 2009/0293448 A1 | 12/2009 | Grote et al. | |
| 2010/0038491 A1 | 2/2010 | Cepollina et al. | |
| 2010/0163683 A1 | 7/2010 | Quine | |
| 2010/0252024 A1 | 10/2010 | Convery | |
| 2010/0269817 A1 | 10/2010 | Kelly | |
| 2010/0294261 A1 | 11/2010 | Deforge | |
| 2010/0319678 A1 | 12/2010 | Maemura et al. | |
| 2011/0031238 A1 | 2/2011 | Segawa | |
| 2011/0041894 A1 | 2/2011 | Liao | |
| 2011/0127382 A1 | 6/2011 | Im | |
| 2011/0185728 A1 | 8/2011 | Meyers et al. | |
| 2011/0220091 A1 | 9/2011 | Kroyzer | |
| 2011/0315678 A1 | 12/2011 | Furuya | |
| 2012/0155966 A1 | 6/2012 | Zillmer | |
| 2013/0021471 A1 | 1/2013 | Waterhouse | |
| 2013/0206209 A1 | 8/2013 | Lasich | |
| 2013/0239952 A1 | 9/2013 | Kroyzer | |
| 2014/0138952 A1 | 5/2014 | Marumoto | |
| 2014/0150651 A1 | 6/2014 | Velasco Valcke | |
| 2014/0174430 A1 | 6/2014 | Fitzgerald et al. | |

(56) References Cited

U.S. PATENT DOCUMENTS

| | | |
|---|---|---|
| 2014/0262278 A1 | 9/2014 | Walton |
| 2014/0318127 A1 | 10/2014 | Kerns |
| 2015/0027102 A1 | 1/2015 | Bahn et al. |
| 2015/0180114 A1 | 6/2015 | Achour |
| 2016/0010442 A1 | 1/2016 | Kearl |
| 2016/0024921 A1 | 1/2016 | Ethridge |
| 2016/0075453 A1 | 3/2016 | Sauzay et al. |
| 2016/0076792 A1 | 3/2016 | Magaldi |
| 2016/0121395 A1 | 5/2016 | Kawanaka |
| 2017/0129579 A1 | 5/2017 | De Jong |
| 2018/0194626 A1 | 7/2018 | Berggren et al. |
| 2018/0238272 A1 | 8/2018 | Renaud |
| 2018/0265224 A1 | 9/2018 | Foulds et al. |
| 2019/0271228 A1* | 9/2019 | Sowers, Jr. ............. E21C 51/00 |
| 2021/0061494 A1 | 3/2021 | Belieres Montero |
| 2021/0197987 A1 | 7/2021 | Kokorich et al. |
| 2022/0024612 A1 | 1/2022 | Sercel et al. |
| 2022/0089302 A1 | 3/2022 | Sercel et al. |
| 2022/0290635 A1 | 9/2022 | Sercel |
| 2023/0130545 A1 | 4/2023 | Sercel |
| 2023/0249848 A1 | 8/2023 | Sercel |
| 2023/0279776 A1 | 9/2023 | Sercel |
| 2023/0280098 A1 | 9/2023 | Small |
| 2023/0383650 A1 | 11/2023 | Sercel |
| 2023/0399946 A1 | 12/2023 | Sercel |
| 2024/0159076 A1 | 5/2024 | Sercel |

FOREIGN PATENT DOCUMENTS

| | | |
|---|---|---|
| DE | 10350734 | 3/2005 |
| DE | 102004026517 B3 | 10/2005 |
| EP | 2 177 846 | 4/2010 |
| EP | 2 195 583 | 3/2013 |
| ES | 2639583 | 10/2017 |
| GB | 1481234 | 7/1977 |
| JP | 2012-038954 | 2/2012 |
| JP | 2019-148155 | 9/2019 |
| RU | 2344973 | 1/2009 |
| RU | 2353775 | 4/2009 |
| WO | WO 16/172647 | 10/2016 |

OTHER PUBLICATIONS

Boyle, A., "Blue Origin Space venture slips in a sneak peek at design of Blue Moon lunar lander", Apr. 5, 2017, https://www.geekwire.com/2017/blue-origin-sneak-peek-blue- moon-lunar-lander/.

Boyle, A., "Jeff Bezos lays out his vision for city on the moon, complete with robots", May 20, 2017, https://www.geekwire.com/2017/jeff-bezos-blue-origin-moon/.

Bussey, D. B. J., et al., "Permanent shadow in simple craters near the lunar poles," Geophysical Research Letters, 2003, vol. 30, No. 6, 1278, pp. 11-1-11-4.

Chen, L.H., et al., Soft spherical tensegrity robot design using rod-centered actuation and control, Journal of Mechanisms and Robotics, 2017, vol. 9(2) pp. 025001.

Chen, M., et al., "Energy analysis of growth adaptable artificial gravity space habitat," AIAA Space and Astronautics Forum and Exposition, 2018,in 13 pages.

Colaprete, A., et al., "Detection of water in the Icross ejecta plume," Science, vol. 330, pp. 463-468, Oct. 22, 2010.

Crawford, I.A., Lunar resources: A review. Progress in Physical Geography, 39(2):137-167, 2015.

Ethridge, E. C., et al., "Microwave Extraction of Volatiles for Mars Science and ISRU. Concepts and Approaches for Mars Exploration". Concepts and Approaches for Mars Exploration; Jun. 2012, pp. 2-14, Houston, TX; United States.

Fabbrocino, F., et al., "Optimal prestress design of composite cable-stayed bridges". Composite Structures, 2017, vol. 169, pp. 167-172.

Feldman, W. C., et al., (1998). "Fluxes of fast and epithermal neutrons from Lunar Prospector", Evidence for water ice at the lunar poles, science 281, 1998, pp. 1496-1500.

Fincannon, J., "Lunar Polar Illumination for Power Analysis", NASA/TM, 2008-215446, https://ntrs.nasa.gov/archive/nasa/casi.ntrs.nasa.gov/20080045536.pdf.

Fisher, E.A., et al., "Evidence for surface water ice in the lunar polar regions using reflectance measurements from the Lunar Orbiter Laser Altimeter and temperature measurements from the Diviner Lunar Radiometer Experiment", Icarus 292, 2017, pp. 74.

Gläser, P., et al., "Illumination conditions at the lunar poles: Implications for future exploration". Planetary and Space Science, in press, 2017, https://doi.org/10.1016/j.pss. 2017.07.006.

Goyal, R., et al., "Modeling of tensegrity structures", Journal of Open Source Software, 2019, vol. 4(42), pp. 1613.

Goyal, R., et al., "Tensegrity system dynamics with rigid bars and massive strings", Multibody System Dynamics, 2019, vol. 46(3) pp. 203-228.

Hayne, P.O., et al., "Evidence for exposed water ice in the Moon's south polar regions from Lunar Reconnaissance Orbiter ultraviolet albedo and temperature measurements". Icarus, 2015, vol. 255, pp. 58-69.

Hayne, P.O., et al., "Diviner Lunar Radiometer Observations of the LCROSS Impact", Science 330, 2010, pp. 477.

Lewis, J.A., "Hard Choices for Manned Spaceflight: America as Icarus", http://csis.org/files/publication/140508_Lewis_HardChoicesMannedSpaceflight_Web.pdf, 2014.

Lewis; Mining the Sky; Untold Riches from the Asteroids, Comets, and Planets; Library of Congress Cataloging-in-Publication Data; ISBN 0-201-47959-1; 1996; 66 pages (pp. 7-11, 32, 49-74, 108-127, 134-141, 198-200).

Li, S. et al., "Possible detection of surface water ice in the lunar polar regions using data from the Moon Mineralogy Mapper (M3)," presented at LPSC XLVIII, Mar. 2017, Houston, TX.

Nagase, K., et al., "Minimal mass tensegrity structures", The International Association for Shell and Spatial Structures, 2014, vol. 55(1), pp. 37-48.

Rapp, D., "Use of Extraterrestrial Resources for Human Space Missions to Moon or Mars (Springer Praxis Books / Astronautical Engineering)" published Nov. 20, 2012.

Reinhold; A Solar Powered Station At A Lunar Pole; Feb. 18, 2021; https://theworld.com/~reinhold/lunarpolar.html; 7 pages.

Rimoli, J.J., et al., "Mechanical response of 3-dimensional tensegrity lattices", Composites Part B: Engineering, 2017, vol. 115, pp. 30-42.

Sabelhaus, A.P., et al. "Model-predictive control of a flexible spine robot", American Control Conference, 2017, IEEE, pp. 5051-5057.

Skelton, R.E., Tensegrity Systems, 2009, Springer US.

Sowers et al., 2019, Ice mining in lunar permanently shadowed regions, New Space, 7(4):235-244.

Sowers, Jun. 12, 2018, Closing the Business Case for Lunar Propellant, PowerPoint presentation, 13 pp.

Spudis, P., et al., "Evidence for water ice on the moon: Results for anomalous polar craters from the Iro mini-rf imaging radar", Journal of Geophysical Research: Planets, 2013, vol. 118(10), pp. 2016-2029.

Squyres, S. and the Nasa Advisory Council, Recommendation Regarding Mismatch Between NASA's Aspirations for Human Space Flight and Its Budget, from the Council Public Deliberation, Jul. 31, 2014.

Stoica, A. et al., NIAC Phase II Final Report, Early Stage Innovation, NASA Innovative Advanced Concepts (NIAC), "TransFormers for Lunar Extreme Environments: Ensuring Long-Term Operations in Regions of Darkness and Low Temperatures", Nov. 2017.

Sultan, C., et al, "Deployment of tensegrity structures", International Journal of Solids and Structures, 2003, vol. 40(18), pp. 4637-4657.

Sunspiral, V., et al, "Tensegrity based probes for planetary exploration: Entry, descent and landing (edl) and surface mobility analysis", International Journal of Planetary Probes, 2013, vol. 7, pp. 13.

Vasavada, A. R., et al., "Near-Surface Temperatures on Mercury and the Moon and the Stability of Polar Ice Deposits". Icarus, 1999, vol. 141, pp. 179-193.

(56) References Cited

OTHER PUBLICATIONS

Antenna-theory.com, 2015, https://www.antenna-theory.com/tutorial/txline/transmissionline.php, Introduction to transmission lines, accessed Aug. 10, 2023.
Antenna-theory.com, 2015, https://antenna-theory.com/antennas/dipole.php 7/7, The dipole antenna, accessed Aug. 10, 2023.
Badescu, V., "Asteroids: Prospective Energy and Material Resources," Jul. 14, 2013, ISBN-13:978-3642392438.
Binzel, R., "Human Spaceflight: Find Asteroids to get to Mars." Nature 514, 559-561, Oct. 29, 2014.
Bliss, T., et al. "Experimental validation of robust resonance entrainment for cpg-controlled tensegrity structures." IEEE Transactions On Control Systems Technology, 2012, vol. 21(3), pp. 666-678.
Bottke, W.F., et al., Debiased orbital and Absolute Magnitude Distribution of the near-Earth objects, Icarus 156, 399-433, 2002.
Bowersox, Kenneth and NASA Advisory Council Committee on Human Exploration and Operations, "NASA Advisory Council Finding on NASA Human Exploration Strategy," from the Council Public Deliberation, Jul. 31, 2014.
Brophy, J., et al, "Spacecraft Conceptual Design for Returning Entire Near-Earth Asteroids," 48th AIAA/ASME/SAE/ASEE Joint Propulsion Conference & Exhibit and 10th International Energy Conversion Engineering Conference, Atlanta, George Jul. 29-Aug. 1, 2012.
Brown, P., et al., The Flux of small near-Earth objects colliding with the Earth, Nature 420, 294-296, 2002.
Cassapakis, C.G., et al., "A Power Antenna for Deep Space Missions," Solar Engineering Editors: J.H. Davidson and J. Chavez. Book No. HO1046, 1996.
Ceruti, Conceptual Design and Preliminary Structural Analysis of Inflatable Basket for an Asteroid Capturing Satellite; Strojniki vestnik—Journal of Mechanical Engineering 61(2015)5, © 2015 Journal of Mechanical Engineering; DOI:10.5545/sv-jme.2014.2063; in 11 pages.
Cohen, Marc M., et al, "Asteroid Mining," AIAA 2013-5304, presented at AIAA Space 2013 Conference and Exposition, Sep. 10-12, 2013, San Diego, CA.
Court, R.W., et al. "Volatile Yields upon Pyrolysis of Carbonaceous Chondrites as Determined by Quantitative Pyrolysis-Fourier Transform Infrared Spectroscopy" presented at the 40th Lunar and Planetary Science Conference, 2009.
Craft, J., et al. "Percussive digging systems for planetary research" IEEE Aerospace and Electronic Systems Magazine, 2010, vol. 25 pp. 21-26.
Crusan, J., "an Evolvable Mars Campaign" NASA Presentation, Jul. 2014, available at https:/www.nasa.gov/sites/default/files/files/20140429-Crusan-Evolvable-Mars-Campaign.pdf.
David, "Asteroid-Mining Plan Would Bake Water Out of Bagged-Up Space Rocks." Space.com, Sep. 18, 2015 (Sep. 18, 2015), pp. 1-5 [online] <URL: http://www.space.com/30582-asteroid-mining-water-propulsion.html>.
Duke, M., et al., "Mining of lunar polar ice", 36th AIAA Aerospace Sciences Meeting and Exhibit, 1998, pp. 1069.
Ehricke, K.A., "The Solar-Powered Space Ship," ARS Paper 310-56, Jun. 1956.
Eldred, et al., "Alternative Scenarios Utilizing Nonterrestrial Resources", Space Resources Scenarios NASA, 1992.
Erickson, K., "Optimal Architecture for an Asteroid Mining Mission: Equipment Details and Integration" Collection of Technical Papers—Space Conference 2006, Sep. 19-21, 2006, San Jose, California; AIAA 2006-7504; in 17 pages.
Etheridge, F.G., "Solar-Rocket System Concept Analysis", Final Report on AFRPL Contract F04611-79-C-0007, AFRPL-TR-79-79, Rockwell International, Space Systems Group, Downey CA 90241, Nov. 1979.
FAA 2012 Commercial Space Transportation Forecasts. Available at http://www.faa.gov/about/office_org/headquarters_offices/ast/media/The_Annual_Compendium_of_Commercial_Space_Transporation_2012.pdf.

Fisher, E.A., et al., "Evidence for surface water ice in the lunar polar regions using reflectance measurements from the Lunar Orbiter Laser Altimeter and temperature measurements from the Diviner Lunar Radiometer Experiment", Lunar Polar Volaties, 2018, LBI Contrib. No. 2087.
Freeland, R.E., et al., "Large Inflatable Deployable Antenna Flight Experiment Results," (AF Paper 97-1.3.01, presented at the 48th Congress of the International Astronautical Federation, Turin, Italy, Oct. 6-10, 1997.
Freeland, R.E., et al., "Significance of the Inflatable Antenna Experiment Technology", AIAA-98-2104 published in the 39th AIAA/ASME/ASCE/AHS/ASC Structures, Structural Dynamics, and Materials Conference and Exhibit, Apr. 1998.
Garenne, A.B., et al, "The Abundance and Stability of Water in Type 1 and 2 Carbonaceous Chondrites," CI, CM, and CRI Geochimica et Cosmochimica Acta 137, 93-112, 2014.
Gertsch, L.S., et al., Laboratory Demonstration and Test of Solar Thermal Asteroid ISRU, funded NASA Early Stage Innovations Space Tech Research Grants, Proposed 2014, funded Jan. 2015.
Gertsch, R.E., et al, "Near Earth Resources," In Near Earth Objects, Annals of the New York Academy of Science, vol. 822, p. 468-510, 1997.
Gertsch, R.E., et al., "Mining near Earth resources," In Near Earth Objects, Annals of the New York Academy of Sciences, vol. 822, p. 511-537, 1997.
Goyal, R., et al., "Analytical study of tensegrity lattices for mass-efficient mechanical energy absorption", International Journal of Space Structures, 2018.
Granvik et al., Abstract, IAU-Symposium: Complex Planetary Systems, Jul. 7-11, 2014, Namur, Belgium.
Granvik, M., et al., "The population of natural Earth satellites," Icarus, 2012.
Griffin, M.D., et al., "Space Vehicle Design, Second Edition (AIAA Education)", pp. 29-37, Feb. 23, 2004.
Grip; Modeling and Simulation of Asteroid Capture Using a Deformable Membrane Capture Device; Proceedings of the ASME 2015 International Design Engineering Technical Conferences & Computers and Information in Engineering Conference; IDETC/CIE 2015; Aug. 2-5, 2015; Boston, USA; In 10 pages.
Grossman, G., et al, "Inflatable Concentrators for Solar Propulsion and Dynamic Space Power." Journal of Solar Energy Engineering, Nov. 1990, vol. 112/229.
Harwood, William, "NASA's proposed asteroid retrieval mission outlined." Posted in Space Flight Now: Apr. 6, 2013. Available at https://spaceflightnow.com/news/n1304/06asteroid/.
Heiken, G.H., et al., "Lunar sourcebook—a user's guide to the moon". NASA,. Cambridge, England, Cambridge University Press, 1991, vol. 753, pp.
Interbartolo III. Michael A, et al., "Prototype Development of an Integrated Mars Atmosphere and Soil-Processing System", Journal of Aerospace Engineering, Jan. 2013, vol. 26(1), pp. 57-66.
Kutter, Bernard, "Transportation and Propellant Resources in the Cislunar Economy", Space Resources Roundtable XIX Planetary & Terrestrial Mining Sciences Symposium. http://www.isruinfo.com/index.php?page=srr_19_ptmss, 2018.
Lawrence, D. J., et al., "Evidence for water ice near Mercury's north pole from messenger Neutron Spectrometer measurements". Science 339, 2013, pp. 292-296.
Lewis, J.A., "Logistical Implications of Water Extraction from Near-Earth Asteroids," Proceedings of the Eleventh SSI-Princeton Conference, May 12-15, 1993.
Lunar Exploration Advisory Group "Commercial Lunar Propellant Architecture A Collaborative Study of Lunar Propellant Production", Final Report. Aug. 2018.
Masten, Jun. 17, 2021, Break the ice: Masten designs rocket mining system to extract lunar water, blog, 8 pp.
Mazanek et al., "Asteroid Retrieval Mission Concept—Trailblazing Our Future in Space and Helping to Protect Us from Earth Impactors." Planetary Defense Conference 2013, pp. 3, 5 [online] <URL: http://ntrs.nasa.gov/archive/nasa/casi.ntrs.nasa.gov/20130013170.pdf>.

(56) References Cited

OTHER PUBLICATIONS

Mazarico, E., et al., "Illumination Conditions of the Lunar Polar Regions Using LOLA Topography." Icarus, vol. 211, No. 2, 2011, pp. 1066-1081., doi: 10.1016/j.icarus. 2010.10.030.
Mommert, M., et al, "Constraining the Physical Properties of Near-Earth Object 2009 BD," The Astrophysical Journal, vol. 786, No. 2.
NASA Report from Office of the Chief Technologist, Emerging Space: The Evolving Landscape of 21st Century American Spaceflight, http://images.spaceref.com/docs/ 2014/Emerging_Space_Report.pdf.
NASA, "Asteroid Redirect Mission Reference Concept," 2013.
Norton, B., "Harnessing Solar Heat," Springer, pp. C1-xiii, 39 and 48-73, ISBN 978-007-7275-5, 2013.
Pike R.J., "Crater dimensions from Apollo data and supplemental sources". The Moon, 1976, vol. 15, pp. 463-477.
Pike, R.J., "Depth/diameter relations of fresh lunar craters: Revision from spacecraft data", Geophysical Research Letters, 1974, vol. 1(7), pp. 291-294.
Ross, Shane D., "Near-Earth Asteroid Mining", Caltech Space Industry Report, Dec. 14, 2001, Control and Dynamical Systems Caltech 107-81, Pasadena CA 91125 available at http://www2.esm.vt.edu/-sdross/papers/ross-asteroid-mining-2001.pdf.
Rostami, J., et al., "Lunar tunnel boring machines", In Earth and Space 2018: Engineering for Extreme Environments, American Society of Civil Engineers, pp. 240-252, 2018, Reston, VA.
Sanders, Oct. 10, 2019, NASA Lunar ISRU Strategy, presented at the What Next for Space Resource Utilization? Workshop, Luxembourg, 20 pp.
Schlaich, M., "The messeturm in Rostock—A tensegrity tower", Journal of the International Association for Shell and Spatial Structures, 2004, vol. 45(2), pp. 93-98.
Sercel, "Demonstration of "Optical Mining" For Excavation of Asteroids and Production of Mission Consumables." NASA SBIR. Apr. 23, 7015 (Apr. 23, 2015), pp. 1-2, [online] <URL: http://sbir.nasa.gov/SBIR/abstracts/15/sbir/phase1/SBIR-15-1-H1 .01-9278. html>.
Sercel, Apr. 22, 2015, Worker Bees: thin-film solar thermal technology enables water-based cis-lunar transportation architecture, ICS Associates Inc., 109 pp.
Sercel, J.C., "Solar Thermal Propulsion for Planetary Spacecraft", presented at the JANNAF Propulsion Conference, San Diego, CA, Apr. 9-12, 1985.
Sercel, J.C., et al., "APIS(Asteroid Provided in-Situ Supplies): 100MT of Water, One Falcon 9 Launch" NIAC Phase 1a proposal submitted Nov. 2014.
Sercel, J.C., et al., "Emerging Space Office Grant (ESO)", "Stepping Stones: Economic Benefits of Asteroid Mining for Exploration of Deep Space" NASA Report, Contract No. NNX16AH11G, 2017.
Sercel; Time Dependent Finite Difference Modeling of Outgassing of Asteroids via Bulk Heating; 978-1-5386-2014-4/18/$31.00 © 2018 IEEE; I 14 pages.
Shao, M.B., et al., "Finding very Small Near-Earth Asteroids using Synthetic Tracking," Astrophysics .J 782:1, 2014, arXiv, 1309.3248.
Shapiro, I and the Committee to Review Near-Earth Object Surveys and Hazard Mitigation Strategies. Final Report, National Research Council, National Academies Press, 2010.
Shoji, J. M., et al., "Solar Thermal Propulsion Status and Future", AIAA-92-1719, AIAA Space Programs and Technologies Conference, Mar. 1992.
Staugaitis, C., et al., "Mechanical and Physical Properties of the Echo II Metal-Polymer Laminate (NASA TND-3409)," NASA Goddard Space Flight Center, 1966.
Stoica, A. et al., "TransFormers of Extreme Environments and Their Integration in a Solar Power Infrastructure". AIAA Space 2016, AIAA Space Forum, 2016.
Taylor, G.J., "Using the Resources of the Moon to Expand Earth's Economic Sphere." Planetary Science Research Discoveries Report (2019): E205. Nov. 14, 2019 http://www.psrd.hawaii.edu/Nov19/PSRD-lunar-isru.pdf.
Thomas, M. et al., "Scaling Characteristics of Inflatable Paraboloid Concentrators", Presented at the Second ASME-JSES-JSME International Solar Energy Conference, Reno, Nevada, Mar. 17-22, 1991.
Tukkaraja, P., et al. Lunar mining and processing for in situ resource utilization, Earth and Space 2018: Engineering for Extreme Environments, American Society of Civil Engineers, 2018, pp. 401-413, Reston, VA.
Ulas et al., 2013, Numerical analysis of regenerative cooling in liquid propellant rocket engines, Aerospace Science and Technology 24(1):187-197.
Wihite, Alan, et al., Evolved Human Space Exploration Architecture Using Commercial Launch/Propellant Depots, 63rd International Astronautical Congress, Naples, Italy, 2012.
Yildiz, K., et al., "Effective beam stiffness properties of n-strut cylindrical tensegrity towers", AIAA Journal, 2019, vol. 57(5), pp. 2185-2194.
Yildiz, K., et al., "A novel deployment strategy for tensegrity towers", AIAA Spacecraft Structures Conference, 2018, pp. 0693.
Zacny; Asteroid Mining; AIAA Space 2013 Conference and Exposition Sep. 10-12, 2013, San Diego, CA; AIAA 2013-5304; in 16 pages.
Zegler, Frank, et al., "Evolving to a Depot-Based Space Transportation Architecture" AIAA Space 2010 Conference and Exposition. Aug. 30-Sep. 2, 2010, Anaheim, CA, AIAA 2010-8638.
Bradford et al., Jul. 9, 2001, Fresnel concentrators for space solar power and solar thermal propulsion: final report, United Applied Technologies, Inc., 22 pp.
Stewart et al., Sep. 1996, Dual fuel solar thermal stage—ideal analysis, Journal of Spacecraft and Rockets, 33(5):752-754.

* cited by examiner

SYSTEMS AND METHODS FOR OBTAINING ENERGY IN SHADOWED REGIONS

PRIORITY, CROSS-REFERENCE AND INCORPORATION

This application is a continuation of U.S. Non-Provisional patent application Ser. No. 16/828,912, filed Mar. 24, 2020, which is based upon and claims the benefit of priority from U.S. Provisional Patent Application No. 62/992,880 filed on Mar. 20, 2020 and from U.S. Provisional Patent Application No. 62/962,147 filed on Jan. 16, 2020. The entire contents of each of the above-listed items is hereby incorporated into this document by reference and made a part of this specification for all purposes, for all that each contains. Moreover, any and all applications for which a foreign or domestic priority claim is identified in the Application Data Sheet of the present application are hereby incorporated by reference under 37 C.F.R. § 1.57.

This invention was made with government support under contract: 80NSSC19K0965 by NASA through the NASA Shared Services Center; the government has certain rights in the invention.

FIELD

The present systems and methods relate to lunar applications of obtaining and delivering power from the Sun.

BACKGROUND

As the Moon and Earth circle the Sun, the Sun always appears (from the surface of the Moon) to be almost directly above the Moon's equator. The Moon's polar regions always point nearly perpendicular to the Sun. As a result, at the Moon's equator, the Sun's rays always strike close to vertically at noon. At the Moon's north and south poles, the Sun's rays always strike nearly horizontally so that in lunar polar regions, uplift regions, mountains, hills, and crater walls cast long horizontal shadows. In the shadows behind many of these topological obstructions, the lunar polar surface remains in perpetual, or nearly perpetual darkness. Such long duration darkness is a significant barrier to lunar exploration, science, and industry.

BRIEF DESCRIPTION OF RELATED ART

Concepts have previously been developed to exploit the sunlight that is available at higher locations, such as the tops of mountains on Earth or at lunar crater rims, even as the lower locations such as the terrestrial valleys or lunar shadowed region floors are in darkness. Heliostats on mountains have been deployed to provide light to human settlements in deep valleys. Stoica 2014 describes a similar method to reflect sunlight into shadowed areas within lunar craters using reflectors positioned on the crater rim. Stoica, Adrian, et al. "Transformers for Extreme Environments: Projecting Favorable Micro-Environments around Robots and Areas of Interest". NASA Innovative Advanced Concepts Final Report, May 2014. U.S. patent application Ser. No. 16/534,321 discloses a system that uses a tower rising from the lower location to the upper elevation where sunlight is found, and a solar array at the top of the tower to generate electricity for equipment in the lower location. Sercel, Joel C. U.S. patent application Ser. No. 16/534,321. "Systems and Methods for Radiant Gas Dynamic Mining of Permafrost for Propellant Extraction." In this system, the solar array tracks the apparent motion of the Sun in the lunar sky as the Moon rotates on its axis. The electric power generated by the solar array is transmitted to the crater floor by electric cables or transmission lines. The delivered electric power can be used to energize mining equipment and to power the life support systems of permanently occupied habitats.

DETAILED DESCRIPTION

Figure 1:
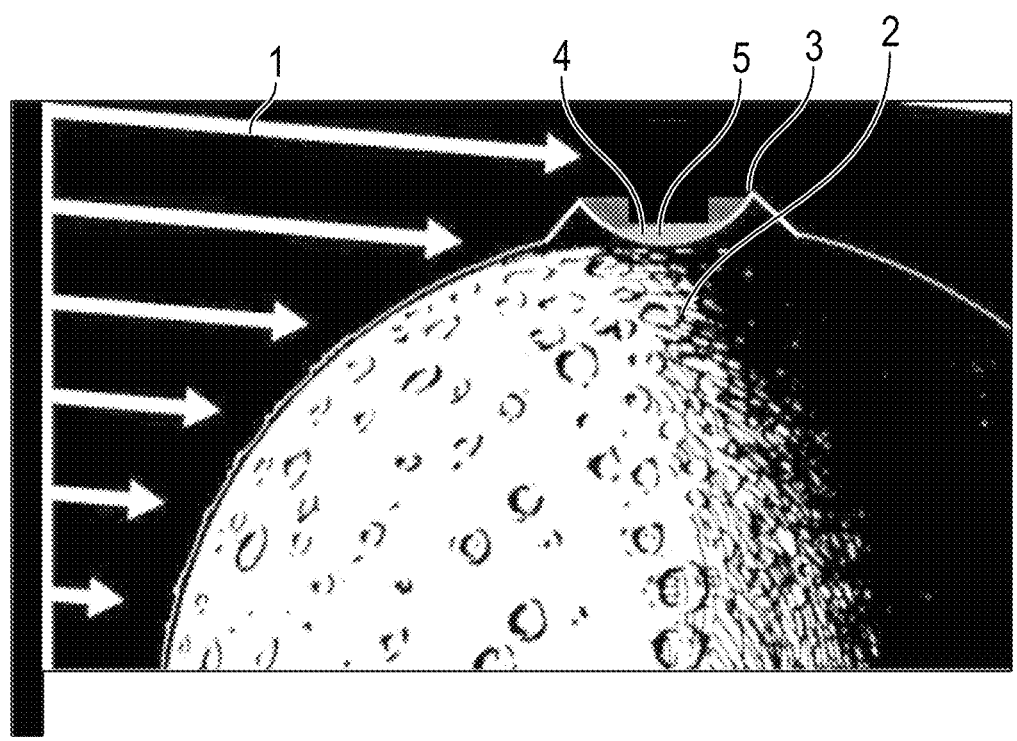
FIG. 1 is a schematic representation of sunlight incident on the polar regions of the Moon.

The present systems and methods relate to obtaining power from the Sun and delivering that power into permanently or significantly shadowed regions at or near the lunar poles where it can be used directly for illumination, concentrated as a source of high quality thermal power, or converted to electric power by photovoltaic solar arrays or other conversion systems. The electric or thermal power is used for any industrial, scientific or exploration purpose including but not limited to powering lunar mining equipment; propellant processing, storage, and handling systems; mobility systems for placement of surface systems and habitats; personnel surface transport; lunar exploration missions; permanent human-occupied settlements and research centers; and tourist hotels on Earth's Moon.

Portions of the lunar surface that remain in perpetual, or nearly perpetual deep darkness pose a significant barrier to lunar exploration, science, and industry. Long duration darkness may seem to rule out the use of the Sun as a power source for long duration landers, outposts and facilities, as long duration energy storage is costly and requires unacceptable amounts of mass. If total or near total darkness with low fractional illumination can be replaced with nearly continuous illumination or illumination punctuated by periods of darkness of limited extent, it would vastly reduce energy storage needs and thereby allow long life or continuous uses of power. The cost of transport to the surface of the Moon is very high; therefore any system that can reduce the mass of material and consumables on the Moon is highly beneficial.

Remote sensing explorations of the polar regions of the Moon's surface indicate the presence of valuable minerals and frozen water which are deposited in regolith material and trapped in significantly shadowed regions which form cold traps where sunlight seldom or never reaches. Without sunlight and exposed only to the cold vacuum of deep space, these materials may have slowly accumulated and lain undisturbed in these cold traps over vast periods of time.

It is desirable to extract the water, other volatile materials, and minerals from these shadowed locations, to support lunar research missions, mining and resource exploitation, water supply for human and industrial use on the Moon, as well as extraction of these resources for other purposes in space such as supplying transportation and supply chains.

It is desirable to provide illumination, thermal power, electric power, telecommunications, and other capabilities to shadowed regions in the lunar polar regions which are naturally permanently or significantly dark, and where lunar mining outposts may be established.

Lunar exploration and resource exploitation frequently requires equipment and materials to be launched from Earth or from locations in space. In such cases, it is desirable to reduce payload weight.

References in this description to an "embodiment" mean that the particular feature or method described is included in at least one embodiment of the inventions and improvements disclosed herein. Such references do not necessarily all refer to the same embodiment, and the embodiments referred to need not be mutually exclusive.

Disclosed are systems and methods to provide illumination, thermal power, electricity, communications, and other services to equipment and locations in permanently shadowed or occasionally shadowed regions such as in valleys, behind mountains, or on the floors of craters in lunar polar regions.

Those skilled in the art will recognize that these systems and methods may be applied to other locations with some or all of the features of the lunar polar terrain, including any of extended darkness, low gravity, challenging terrain for landing and movement, limited or challenging communications, inhospitality to human life, and high expense required for resource exploitation. Illustrative sites for such applications include any of asteroids, dwarf, minor, and major planets and their satellites, comets, high latitude locations on the Earth, terrestrial mountains, caves, and remote mining locations, exploration of and resource extraction from undersea structures, and covert or military operations in restricted environments.

Disclosed systems include several useful aspects that may be used separately or together. These can include, for example: a tower structure, reflective elements (e.g., in an upper section of the tower), reflective elements (e.g., in a lower section of the tower), solar electric power systems, radio communications equipment including transmitters, receivers, and relays, specialized emitters and receivers for infrared, ultraviolet, laser, and other transmissions. Also disclosed are methods to orient the reflective elements, methods to package the tower structure for transport, and methods to deploy the tower structure. Calculations and systematic illumination studies of the Moon based on topology and orbital motion show that a 1 km-high tower placed with its base in permanently showed regions on the Moon, one near the north pole and one hear the south pole, can provide continuous illumination of a shadowed region below for 93% of the time, with the longest duration of darkness being about 50 hours. In addition there are many locations near the edges of permanently shadowed regions in which towers of lesser height, typically only 50 m to 100 m tall, can increase fraction illumination greatly (for example from a few percent per year to 50% illumination, with maximum shadow periods of only days or weeks). This effectively opens vast regions of the Moon to exploration and use by long-duration landers and outposts, for example.

Tower Structure

In some embodiments, the tower structure is preferably a tensegrity structure composed of small diameter cables or cords in tension and corresponding small diameter rigid members in compression. The tensegrity structure preferably provides minimal obscuration of light and communications signals at a minimum of mass and cost.

In some embodiments, the tower structure and associated equipment such as reflectors and solar arrays are arranged so as to be compactly folded into a closed position so that they may be delivered as a single assembly to the lunar surface by a single lunar landing vehicle. In some embodiments, initial calculations show that an 800 m-tall tower weighing 2400 kg can support a 600 kg thin-film heliostat and a 5000 kg solar array, provide 1 MW of power, and can be launched on a single heavy-lift launch vehicle.

In some embodiments, the tower structure and associated equipment are arranged so that upon being delivered to the lunar surface, they may automatically unfold and self-erect.

In some embodiments, the tower structure may be constructed through a process of self-inflation.

In some embodiments, the tower structure may be constructed of conventional or unique materials including any of metal, plastics, concrete, carbon fiber, and other suitable materials using any of bolting, welding, extrusion, additive depositing, or other construction method as is appropriate for the soil, atmospheric conditions, gravity, desired height, and other relevant factors. In some embodiments, the tower structure may be constructed from Aluminum, which may have benefits over other materials such as reduced cost, and ease of fabrication. In some embodiments, the tower structure can be constructed from a sintered regolith or locally produced forms of concrete can made from regolith, enabling a reduced mass of materials launched from the Earth to reduce cost. In addition, aluminum can be made easily from lunar regolith and then into sheets. These sheets can be formed into tubes and structures for the tower locally to reduce transport costs.

Those skilled in the art will recognize that the tower structure may be implemented vertically, horizontally, or at any other angle in the same manner as disclosed.

Reflectors

In some embodiments, one or more reflective elements are placed in the upper section of the tower.

In some embodiments, one reflective element in the upper section of the tower is an optical reflector such as a mirror that reflects sunlight from a sunlit region at or above the shadowed region, such as at or above the rim of a lunar crater or a hill side, into the shadowed region, such as valleys, depressions, or crater walls or floors.

In some embodiments, one reflective element in the upper section of the tower is a large lightweight heliostat, made of materials such as thin-film polymers, that tracks the position of the Sun in the lunar sky and reflects sunlight into the shadowed region, such as valleys, depressions, or crater walls or floors.

In some embodiments, one reflective element in the upper section of the tower reflects sunlight vertically or substantially vertically downwards, or at another appropriate angle, to elements that may be located in the lower section of the tower.

In some embodiments, one reflective element in the upper section of the tower is a divergent optical reflector, such as a convex mirror, a rigid circumferential torus with a highly reflective surface, or a diffuse reflector of any shape which distributes the incident sunlight in a diffused manner to a broad area on the interior of the shadowed region.

In some embodiments, one reflective element in the upper section of the tower is a concentrating optical reflector such as a concave mirror that provides a more focused, brighter illumination or thermal power over a narrow area within the interior of the shadowed region.

In some embodiments, one reflective element in the upper section of the tower is a communications device such as a reflector, relay, or transceiver that provides communication services between the interior of the shadowed region such as valleys, depressions, or crater walls or floors and any of other locations within the shadowed region, on the lunar surface, in lunar or terrestrial orbit, in other locations in space, or on Earth, using radio, infrared, or ultraviolet frequencies, lasers, or other signals. Those skilled in the art will recognize that the communications device is not limited to these signaling methods, and may be implemented using any current or future signaling method.

In some illustrative embodiments, the communications device is a radio frequency reflector that is substantially transparent or non-occluding to sunlight and may be constructed of an open grid of fine wires. The radio frequency mirror preferably directs radio waves to and from Earth downward along the axis of the tower. The radio frequency reflector may be preferably independently actuated to follow the apparent position of the Earth which is generally not the same direction as the apparent position of the Sun.

Receiving Elements

The sunlight, radio communications, and other signals reflected by the reflective elements in the upper section of the tower may be used by one or more elements in a shadowed region. The lower section of the tower can be in a shadowed region, or the reflective elements may direct solar energy to a location remote from the tower.

In some embodiments, a solar electric power system such as a photovoltaic solar array is positioned at the base of the tower (or in another convenient receiving location) so that the reflected sunlight from the surface is incident on it. By this method, relatively heavy solar electric power systems remain stationary on the surface of the shadowed region. In some embodiments, the only moving part can be a light weight heliostat mirror. This method eliminates the cost and weight of both electric power transmission cables and of the mechanical systems needed to rotate solar arrays.

In some embodiments, an optical reflector is positioned in the lower section of the tower to direct the reflected sunlight to a third element located elsewhere in the shadowed region. Additional reflectors can be strategically positioned to direct solar energy and/or other signals around various obstructions that can include tower supports, geological obstacles, etc.

In some embodiments, a communications device such as a reflector, relay, or transceiver is positioned in the lower section of the tower to allow signals to be received and transmitted between the shadowed region and the upper section of the tower.

In some embodiments, a radio frequency reflector is placed in the lower section of the tower to allow signals to be reflected away from the tower and received by a radio receiver which may be located some distance away from the solar energy array at the base of the tower. Using the same system, a radio transmitter may be co-located with the radio receiver and transmit signals that will be reflected by the lower reflector to the upper section of the tower.

Illustrative Embodiments

Various embodiments of the present disclosure are now described in detail with reference to the drawings. Like reference numerals are used to refer to like elements throughout.

Referring to FIG. 1, sunlight 1 illuminates the surface of the Moon from a direction almost directly above the Moon's equator. In polar regions 2, the rays of sunlight arrive almost horizontally above the lunar surface and cast long deep shadows. Unlike Earth, the Moon's rotation axis is much less tilted with respect to its orbital plane around the Sun, so the seasonal changes in illumination on the Moon are much reduced. Crater rims 3 or other topologic features permanently or significantly block sunlight from reaching the crater floor or otherwise shadowed region 4. Regolith material 5 at and beneath the surface of the shadowed region may contain valuable minerals and water ice.

Figure 2:
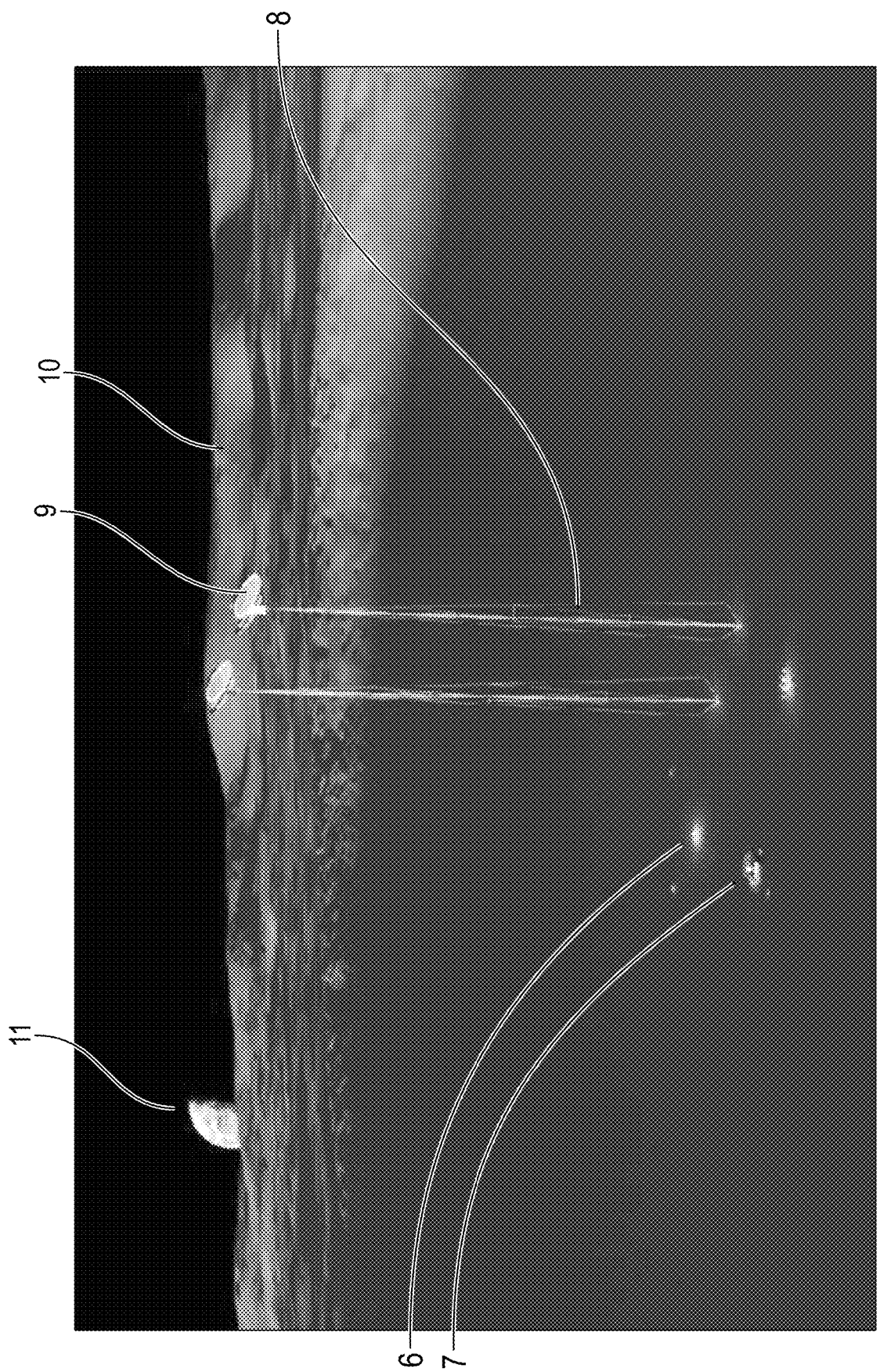
FIG. 2 is a schematic representation of a lunar mining base located on the floor of a crater like lunar valley, an illustrative shadowed region.

Referring to FIG. 2, a lunar mining post can be situated on the floor of a dark crater or other shadowed region such as a valley or depression. Personnel or robotic habitats 6 and mining equipment 7 operate in low light levels where the principle or only area illumination comes from towers 8. Light weight mirrors 9 at the top of the towers 8 extend above or at least closer to the altitude of the obstructing geographic feature 10. In some embodiments, from their altitude, the mirrors 9 can have a continuous or more frequent view of the Earth 11 and/or of the Sun (not shown). As the Moon rotates about its axis during the course of a month, the apparent position of the Earth 11 and the Sun will been seen to move in a circle around and above the obstructing geographic feature 10. The mirrors 9 can be configured to slowly rotate to continually face the Sun or Earth 11, thereby allowing more consistent access to solar energy and/or communication signals to and from Earth 11.

Figure 3:
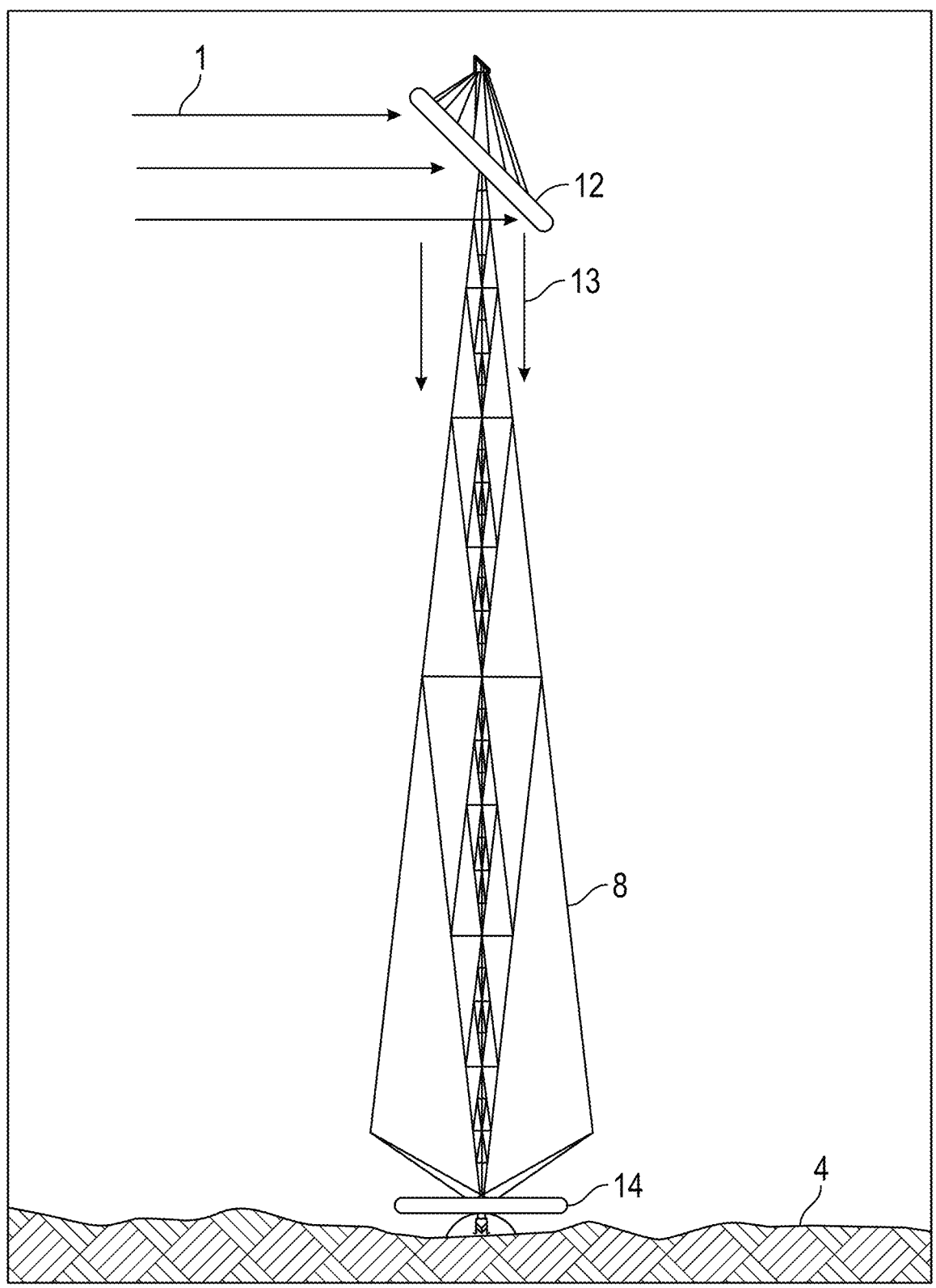
FIG. 3 illustrates a heliostat and tower system installed at a dark shadowed location on the Moon, an illustrative shadowed region.

Referring to FIG. 3, a tower 8 is erected in a shadowed region 4. In this illustrative embodiment, at the top of the tower, a heliostat mirror 12 is inclined at approximately 45 degrees from the vertical. The mirror 12 reflects incoming rays from the Sun 1 in a downward direction toward the shadowed region. Near the base of the tower 8, a photovoltaic solar array 14 receives the sunlight and converts it to electric power. The heliostat 12, the tower 8, and the solar array 14, can be advantageously sized and configured to deliver large amounts (e.g., approximately 1.5 megawatts) of continuous or near-continuous electric power. Certain factors that can affect the amount of power produced include efficiency of photovoltaic system, cross sectional area of reflectors, amount of energy loss from reflections, consistency of illumination at the location, etc. The tower 8 height in this illustrative embodiment is 800 meters tall. Depending on its size, a single lunar mining operation may require multiple towers of these dimensions and related systems to supply its energy needs. Although the photovoltaic solar array 14 is illustrated as being located near the base of the tower 8 in FIG. 3, in other embodiments, the photovoltaic solar array 14 can be located at another location within the shadowed region 4 (e.g., near the personnel or android habitats 6 and mining equipment 7 illustrated in FIG. 2), and the heliostat mirror 12 may be inclined at a different angle to reflect the incoming rays from the Sun 1 towards the photovoltaic solar array 14.

FIG. 3 illustrates a further design feature of the tower 8. The downward directed light 13 passes through and among the tensegrity structure elements of the tower 8. The tensegrity structure can include small diameter cables or cords in tension and corresponding small diameter rigid members in compression. This construction method can help reduce launch weight. It also presents very minimal obscuration to downward directed light. Using such structures can allow the solar array 14 to be placed directly at the base of the tower 8 with minimal loss of light collection efficiency.

Figure 4:
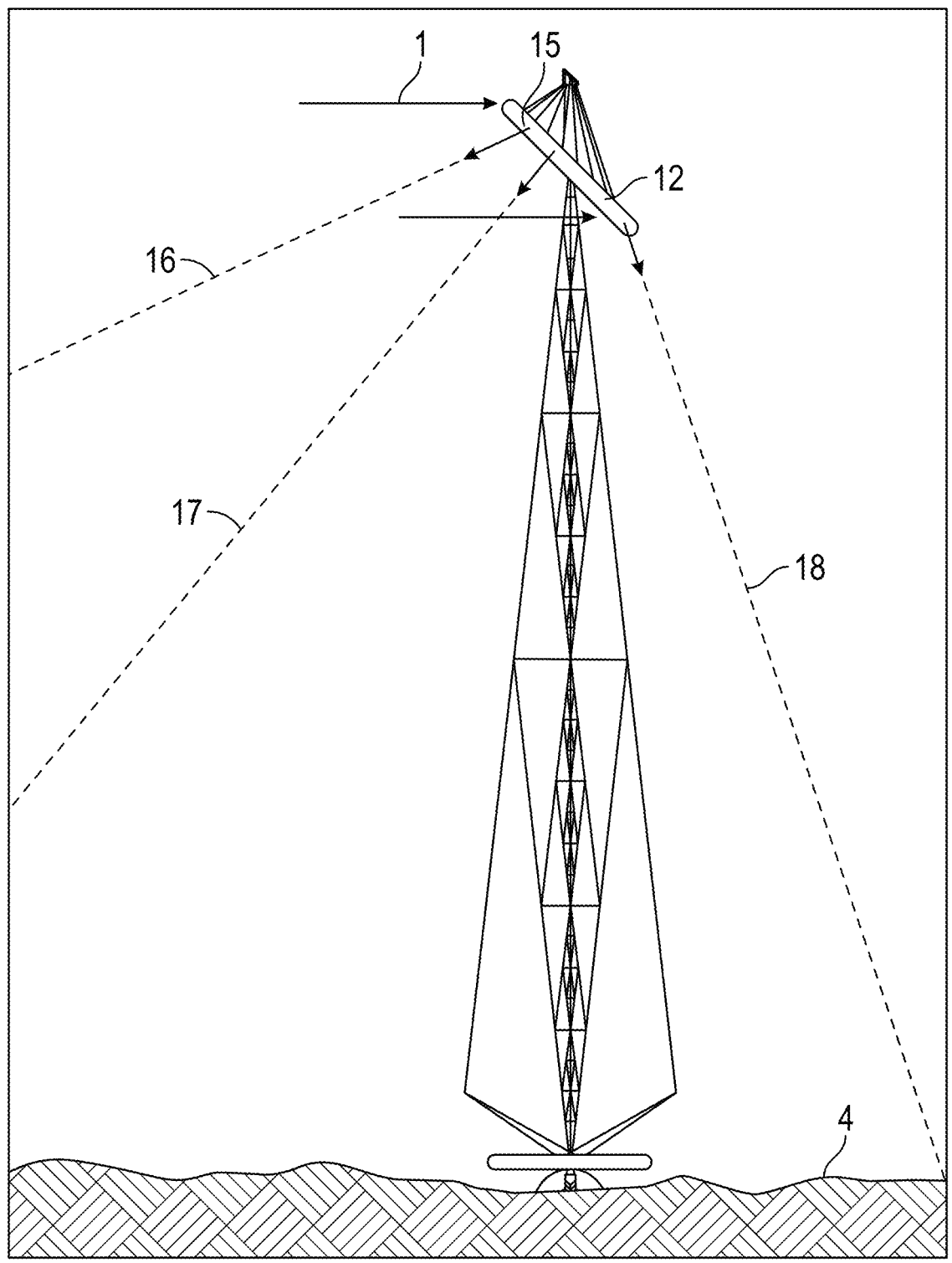
FIG. 4 illustrates means to provide low intensity wide-area diffuse illumination of a shadowed region floor.

Referring to FIG. 4, the heliostat mirror 12 is provided with a circumferential disc or torus structural element that holds the thin film reflecting surface in alignment. The circumferential torus is further provided with a specular or diffuse reflective curved surface 15. Incoming sunlight 1 is reflected and scattered by the curved surface 15 into many directions 16, 17, and 18. By this means the towers 8 can provide diffuse low intensity area illumination of the shadowed region 4.

Figure 5:
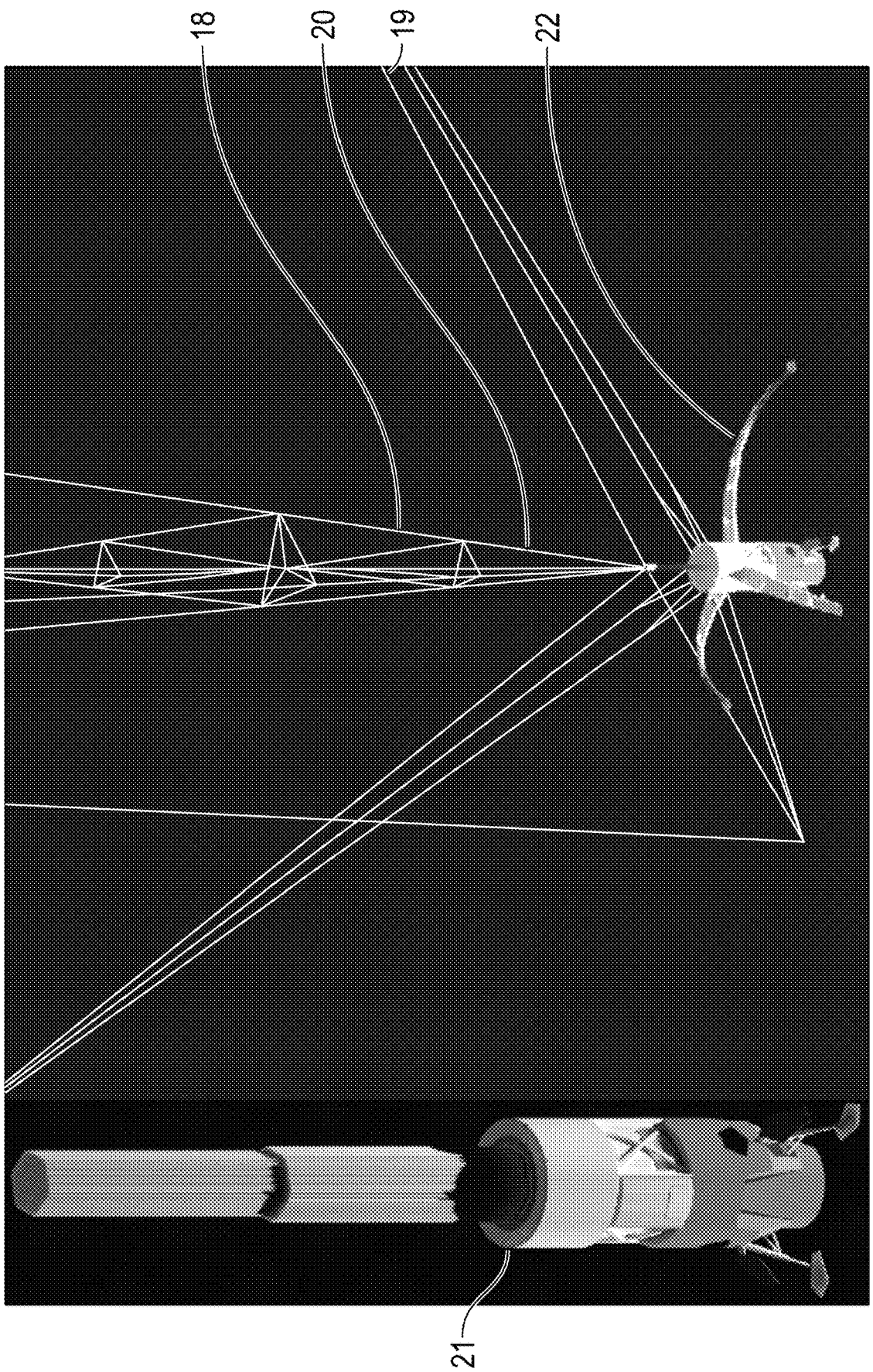
FIG. 5 illustrates a lunar landing craft immediately prior to deployment of the system.

Referring to FIG. 5, a tower 8 is shown in close up detail near the tower base. Prior to landing and at touchdown, all elements of the landing vehicle 21 are compactly folded. After landing, stabilizing legs 22 deploy to the dark surface. The tensegrity structure consists of multiple small diameter cables or cords 18 and 19 and rigid compression members 20. The tensegrity structure of the tower 8 can be self-erecting up to heights exceeding 1000 meters. It can use a motor or other stored energy (e.g., in springs) to accomplish this. It can be under tension or otherwise store energy during transport.

Figure 6:
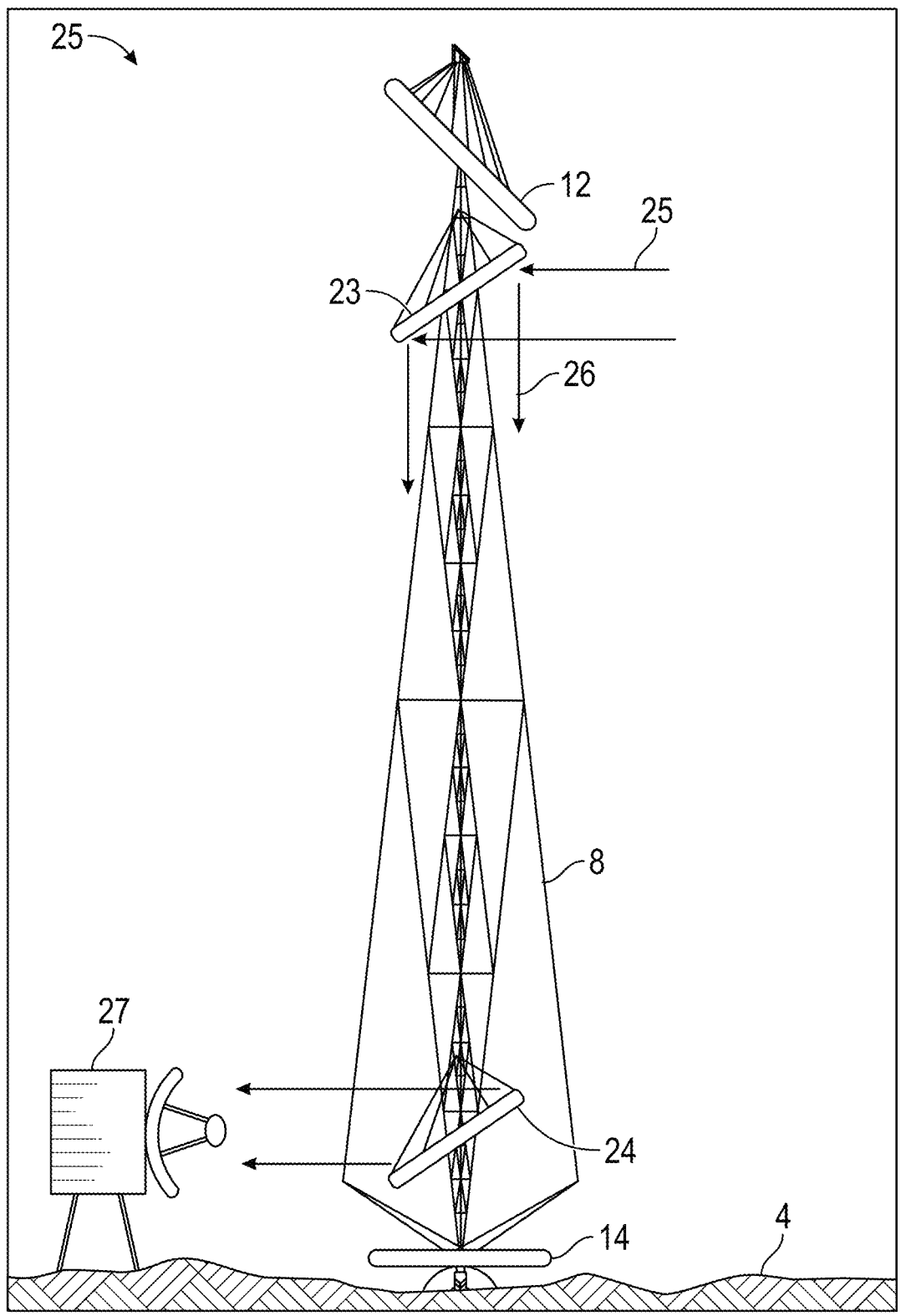
FIG. 6 illustrates the pointing and tracking system for a two-way radio communication system that is integrated into the tower system.

Referring to FIG. 6, a tower 8 is provided with an upper radio-frequency reflecting mirror 23 and a lower radio-frequency reflecting mirror 24. Upper mirror 23 is actuated to rotate and continually face toward Earth as the Moon rotates on its axis. Incoming radio waves 25 from Earth are reflected 26 from the upper mirror 23 toward the base of the tower. The reflected waves 26 encounter the lower radio-frequency reflecting mirror 24 and are directed to a nearby radio receiver/transmitter facility 27 where communication from Earth may be received. Facility 27 can also transmit radio signals back to Earth over the same path in a reciprocal direction, thus providing a two-way communication link with Earth. Both upper and lower mirrors 23 and 24 are substantially transparent to visible light. They may be constructed, for example, from an open grid of small wires. Visible sunlight can pass with minimal obstruction through the radio-frequency reflecting mirrors 23 and 24 directly to the receiving solar array 14 located near the tower 8 base.

Figure 7:
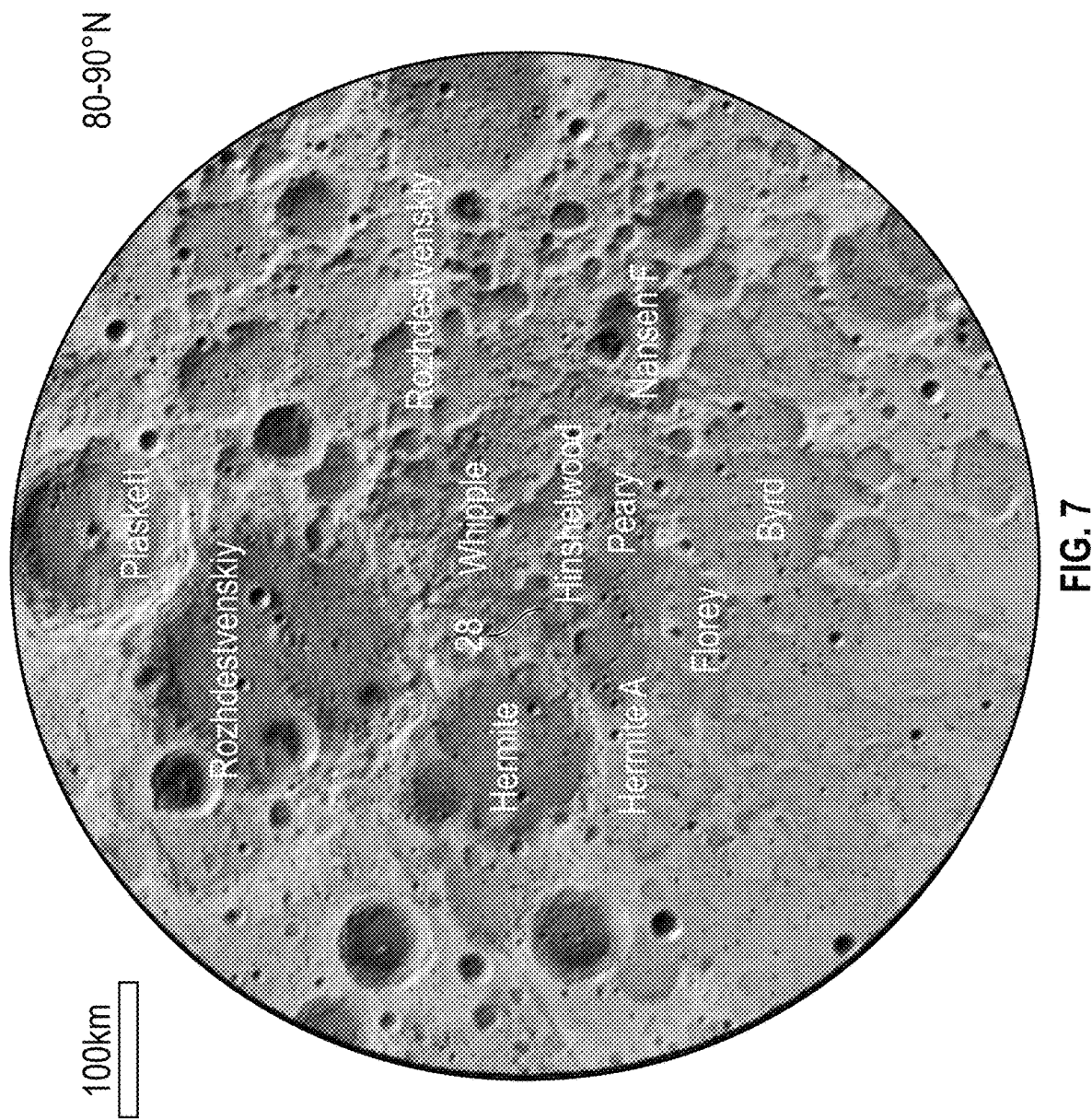
FIG. 7 illustrates a preferred landing site near the north pole of the Moon.

FIG. 7 is a photo map of the craters surrounding the north pole of the Moon. An example outpost site for deployment of the structures disclosed herein is shown at 28 located midway between the craters Whipple and Hinshelwood. This location has been identified following an illumination study on the lunar polar regions based on wobble and tilt characteristics of the Moon's orbit as an example for locations on the celestial body, and a topological study to find the height above ground level of light-obstructing geologic features. The data from the illumination study and the topological study were analyzed to determine for the fraction of the year each location in the lunar polar regions is illuminated as well as the maximum shadow period at the location. The preferred location has a significant shadowed region proximal to a well-illuminated region. It is also relatively flat terrain that facilitates the landing of a payload, and has a relatively low altitude differential between the illuminated region and the shadowed region.

Figure 8:
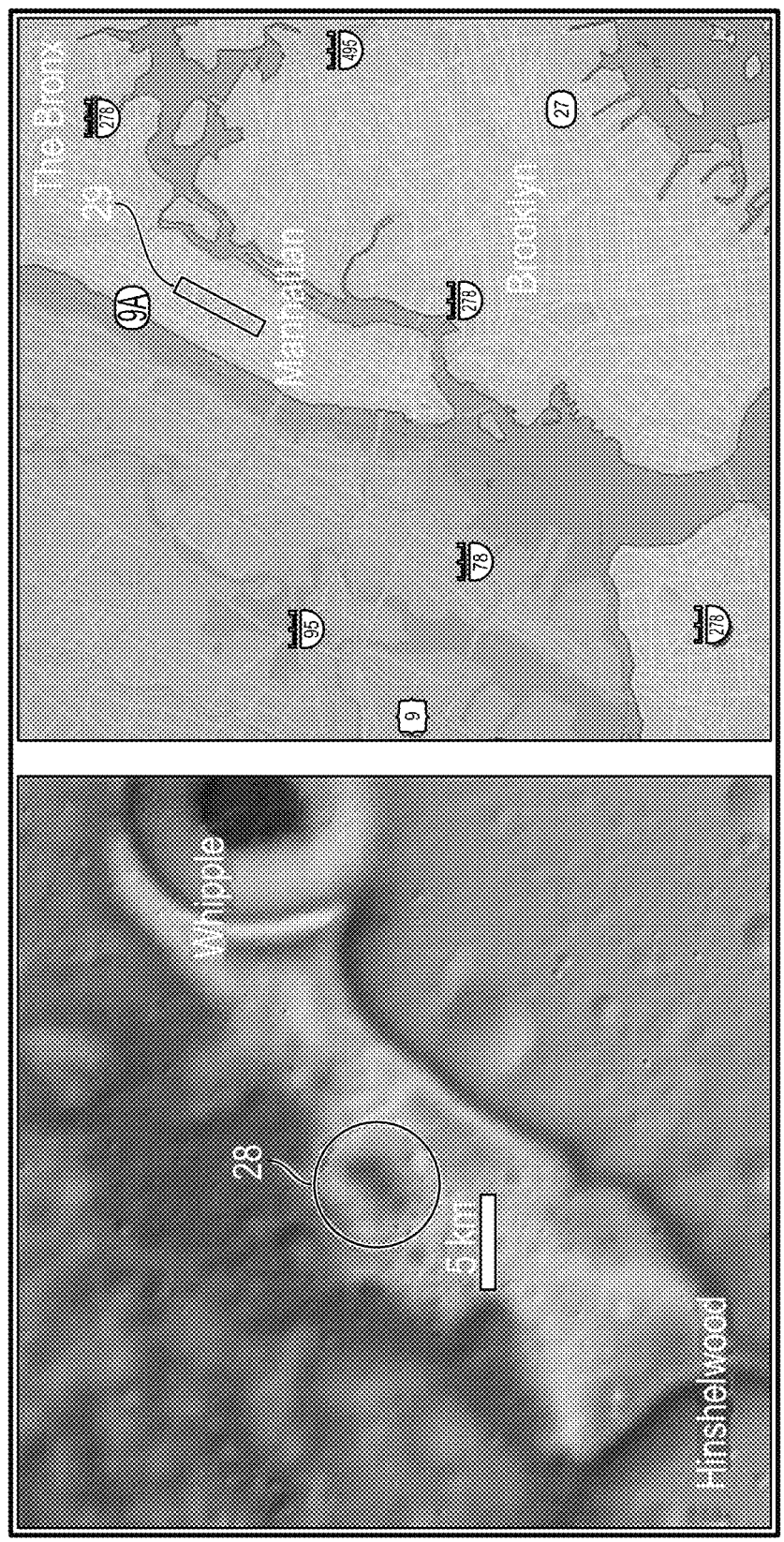
FIG. 8 shows details of a preferred landing site.

FIG. 8 is a close overhead view of location 28. The lunar map is compared to a map of New York City. The proposed mining site 28 is approximately the size of Central Park 29.

Further Example Embodiments

Disclosed is a system for illuminating shadowed regions of a celestial body. The system can have: a tower having an upper section and configured to position the upper section in a sunlit region of the celestial body; at least one reflector supported in the upper section of the tower and configured to direct sunlight to at least one receiving zone in a shadowed region of the celestial body that is not illuminated when sunlight illuminates the reflector; at least one converter in the at least one receiving zone, the converter configured to receive sunlight and convert the sunlight into another form of energy; and an energy distribution system linked to the converter and configured to convey energy from the converter to locations within the shadowed region. The system can also have a heliostat device configured to adjust orientation of the one or more reflectors supported in the upper section of the tower such that the one or more reflectors consistently direct available sunlight to the receiving zone. The tower can also have a lower section and be configured to position the lower section in the shadowed region of the celestial body. The system can have a second reflector configured to direct the received sunlight to a converter at a second receiving zone.

The tower can be a tensegrity structure having both rigid compressive members and non-rigid tensile components. The tower can have an upper section that comprises a low-occlusion zone configured to allow sunlight to reach the reflector while minimizing occlusion, an internal pathway configured to allow transmission of reflected light from the reflector, and a receiving zone in its lower section configured to receive the reflected light. The receiving zone can comprises one or more photovoltaic elements (e.g., in an array) configured to convert the sunlight into electrical energy.

The system can have an upper communications device in the upper section of the tower, the upper communications device comprising one or more of a relay, a signal reflector, transceiver; transmitter, and a receiver. It can also have a lower communications device at the receiving zone comprising one or more of a relay, signal reflector, transceiver, transmitter, and a receiver. It can also have a communications system configured to process signals received in or transmitted from the receiving zone to thereby facilitate communications between locations in the shadowed region as well as between locations in the shadowed region and locations outside the shadowed regions. The upper and/or lower communications devices can comprise at least one of: a signal reflector; a radio frequency transmitter and receiver; an infrared transmitter and receiver; an ultraviolet transmitter and receiver; and a laser transmitter and receiver. The signal reflector can be substantially non-occluding to sunlight.

The heliostat device can comprise a mirror surface supported by a rigid circumferential torus having an outer surface. The outer surface of the torus can be highly reflecting such that visible light striking the outer surface of the torus reflects or scatters across the shadowed region, thus providing low-intensity area illumination of the shadowed region.

Disclosed is a method of preparing, delivering and installing the system(s) described above. The method can include one or more of the following steps: compactly folding the tower, reflectors, and converters into a closed position to facilitate delivering them as a single assembly; delivering the single assembly to the surface of a celestial body using a single landing vehicle; automatically unfolding the delivered tower, mirror, and solar arrays; and automatically erecting the unfolded tower, mirror, and solar arrays.

A method of installing the above-described systems can comprise: manufacturing the tower using an inflatable material such as a lightweight polymer; and inflating the material to form the tower structure using a compressor and a source of compressed gas. A method for installing the system(s)

described above can comprise manufacturing the tower in situ using any of additive manufacturing or extrusion techniques.

Disclosed is a system for illuminating shadowed regions of a lunar or planetary surface. The system can comprise: a tower configured to support one or more reflectors and position them to receive sunlight; at least one reflector supported by the tower and configured to direct sunlight to at least one receiving location in a shadowed region that is not illuminated when sunlight illuminates the reflector; a heliostat device configured to adjust reflector orientation over time such that the reflector consistently directs sunlight to the at least one receiving location; a convertor at the at least one receiving location configured to receive sunlight from the at least one reflector and convert the sunlight to another form of energy; and an energy distribution system linked to the convertor and configured to convey energy from the convertor to use locations within the shadowed region.

The tower can comprise signal transmission regions configured to facilitate transmission of communication signals via the tower. The tower can incorporate thin members configured to avoid obscuring sunlight available to reflect toward the receiving location and improve the function of transmission regions of the tower. The tower can comprise a tensegrity structure having both rigid members and non-rigid tensile components. The tower can comprise an upper low-occlusion zone configured to allow sunlight to reach the reflector while minimizing occlusion, an internal pathway configured to allow transmission of reflected light from the reflector, and a lower receiving zone configured to receive the reflected light. The lower receiving zone can comprise a photovoltaic array configured to convert the sunlight into electrical energy.

The tower can be, for example, between 500 and 1000 meters tall and include at least one foot at its base that is positioned in a more shadowed region while the reflector is positioned in an upper, less shadowed portion of the tower. The heliostat device can comprise a thin film heliostat weighing less than one third the weight of the tower and configured to rotate, thereby tracking the apparent position of the Sun as seen from the upper, less shadowed portion of the tower. The converter can be configured to convert the energy to electrical energy using at least one photovoltaic device.

A method for installing the system(s) above can comprise: compactly folding the tower, the at least one reflector, and the heliostat device into a closed position and delivering them as a single assembly; delivering the single assembly to the surface of a celestial body using a single landing vehicle; and automatically unfolding the tower, the at least one reflector, and the heliostat device upon delivery, and automatically erecting them.

The heliostat can be supported by a rigid circumferential torus, wherein the surface of the torus is highly reflective and causes visible light which strikes the torus to be reflected or scattered across the shadowed region thus providing low-intensity area illumination of the shadowed region.

The systems described above can include a communications device placed in an upper section of the tower and including at least one of the following: of a relay, a reflector, and a transceiver. The communications device can comprise a radio frequency mirror that is substantially transparent or non-occluding to sunlight. The radio frequency mirror can be constructed of an open grid of fine wires. The communications device can be placed below the heliostat device in the upper section of the tower.

The system can further comprise a transceiver device placed at a base of the tower and configured to permit two-way communication with other locations. The transceiver device can comprise at least one of the following: a radio frequency transmitter and receiver, an infrared transmitter and receiver, an ultraviolet transmitter and receiver, or a laser transmitter and receiver. The system can further comprise a radio frequency mirror placed near a base of the tower to allow communications with a transceiver device in the shadowed region that is not at the base of the tower.

Disclosed is a method of identifying a location for installing the above described systems. The method can include one or more of the following steps: conducting an illumination study on the celestial body to find local wobble and tilt characteristics for locations on the celestial body; conducting a topological study to find the height of locations on the celestial body; analyzing the data from the illumination study and the topological study to determine for each location the fraction of the year the location is illuminated and the maximum shadow period at the location; and identifying locations with desirable characteristics, including any of size of a shadowed region, proximity of a well-illuminated location to a shadowed region, topological characteristics conducive to landing a spacecraft payload, and low altitude differential between the well-illuminated location and the shadowed region.

Disclosed is a method for directing energy from sunlight into a shadowed region on the lunar polar surface. The method can include one or more of the following steps: using at least one reflector supported by a tower to redirect sunlight to at least one receiving location in a shadowed region, the tower configured to support the one or more reflectors and position the one or more reflectors to receive sunlight; redirecting the at least one reflector over time such that the reflector consistency redirects sunlight to the at least one receiving zone; receiving the redirected sunlight at one or more solar energy conversion arrays disposed in a shadowed region; and converting the received sunlight into electrical energy at the one or more solar energy conversion arrays.

The tower can be a lightweight tensegrity structure placed on the floor of the shadowed region and extending above the altitude of sunlight blocking topological features into a region of substantially continuous sun illumination. The at least one reflector can comprise a heliostat placed at a top of the tower and configured to be actuated to slowly rotate in order to track the apparent position of the Sun during the monthly rotational period of the Moon. The tower of the method can be substantially transparent or non-occluding to light which may be reflected from the at least one reflector.

The method can further comprise: compactly folding the tower, the at least one reflector, and the one or more solar energy conversion arrays into a closed position as a single assembly; and delivering the folded single assembly to the lunar surface by a single lunar landing vehicle. The method can further comprise: automatically unfolding and self-erecting the tower, the at least one reflector, and the one or more solar energy conversion arrays upon landing. In this method, the heliostat can be supported by a rigid circumferential torus, wherein the surface of the torus is highly reflective and causes visible light which strikes the torus to be reflected or scattered across the floor of the shadowed region thus providing low-intensity area illumination of the historically dark region. A radio frequency reflecting mirror can be placed below the heliostat at the top of the tower, wherein the radio frequency mirror is substantially non-occluding to sunlight. A radio frequency transmitter and receiver can be placed at a base of the tower to permit two-way communication with Earth, for example. A second radio frequency mirror can be placed near the base of the tower to reflect radio waves away from the base of the tower toward a nearby radio transmitter and receiver.

Reference throughout this specification to "some embodiments" or "an embodiment" means that a particular feature, structure or characteristic described in connection with the embodiment is included in at least some embodiments. Thus, appearances of the phrases "in some embodiments" or "in an embodiment" in various places throughout this specification are not necessarily all referring to the same embodiment and may refer to one or more of the same or different embodiments. Furthermore, the particular features, structures or characteristics can be combined in any suitable manner, as would be apparent to one of ordinary skill in the art from this disclosure, in one or more embodiments.

As used in this application, the terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Similarly, it should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Rather, inventive aspects lie in a combination of fewer than all features of any single foregoing disclosed embodiment.

Embodiments of the disclosed systems and methods can be used and/or implemented with local and/or remote devices, components, and/or modules. The term "remote" may include devices, components, and/or modules not stored locally. Thus, a remote device may include a device which is physically located in the same general area and connected via a device such as a switch or a local area network. In other situations, a remote device may also be located in a separate geographic area, such as, for example, in a different location, building, valley, and so forth.

A number of applications, publications, and external documents may be incorporated by reference herein. Any conflict or contradiction between a statement in the body text of this specification and a statement in any of the incorporated documents is to be resolved in favor of the statement in the body text.

Although described in the illustrative context of certain preferred embodiments and examples, it will be understood by those skilled in the art that the disclosure extends beyond the specifically described embodiments to other alternative embodiments and/or uses and obvious modifications and equivalents. Thus, it is intended that the scope of the claims which follow should not be limited by the particular embodiments described above.

What is claimed is:

1. A method for providing at least two forms of energy to a region persistently shadowed by at least one topological feature, the method comprising:
    positioning a self-erecting tower in a region persistently shadowed by the at least one topological feature such that the tower extends into a lighted space above the persistently shadowed region;
    supporting at least one reflector in the self-erecting tower in the lighted space and positioning the at least one reflector to direct light energy onto a floor of the region persistently shadowed by the at least one topological feature, thereby providing a first form of energy;
    positioning the at least one reflector over time such that the at least one reflector consistently redirects sunlight to at least one conversion location disposed on the floor of the shadowed region;
    providing, at the at least one conversion location on the floor of the shadowed region, one or more solar energy converters;
    converting the received sunlight into electrical energy at the one or more solar energy converters, thereby providing a second form of energy;
    providing a first radio frequency transceiver at the tower, thereby permitting two-way communication with Earth; and
    locating a second radio frequency transceiver on or near the tower to send or receive signals to other locations within the lunar polar region,
    wherein the tower is substantially transparent to the sunlight reflected from the at least one reflector passing through the tower.

2. The method of claim 1, wherein:
the tower is a lightweight tensegrity structure placed on the floor of the shadowed region and extends above an altitude of the at least one topological feature into a region of substantially continuous sun illumination, and
the at least one reflector comprises a heliostat placed at or near a top of the tower, the heliostat configured to be actuated to slowly rotate in order to track an apparent position of the sun.

3. The method of claim 2, wherein:
positioning the self-erecting tower in the region persistently shadowed by at least one topological feature comprises positioning the tower in a crater in a lunar polar region, and
the heliostat is further configured to extend upwardly to avoid a shadow of a rim of the crater and reflect energy propagated from the apparent position of the sun during the monthly rotational period of the Moon.

4. The method of claim 3, wherein:
positioning the tower in a crater in a lunar polar region further comprises:
    folding the tower, the at least one reflector, and the one or more solar energy converters into a closed position as a single assembly;
    delivering the folded single assembly to a lunar surface by a lunar landing vehicle;
    automatically unfolding, and allowing to self erect, the tower, the at least one reflector, and the one or more solar energy converters.

5. The method of claim 2, wherein the heliostat comprises a thin film heliostat weighing less than one third the weight of the tower.

6. The method of claim 1, wherein the shadowed region comprises a permanently shadowed surface region of a celestial body that is not illuminated when sunlight illuminates the at least one reflector.

7. The method of claim 6, wherein the tower is between 500 and 1000 meters tall having at least one foot at its base that is positioned in the permanently-shadowed surface region and configured to support the at least one reflector and position the at least one reflector in an upper, less shadowed portion of the tower to receive sunlight.

8. A method for providing at least two forms of energy to a region persistently shadowed by at least one topological feature, the method comprising:
positioning a self-erecting tower in a region persistently shadowed by the at least one topological feature such that the tower extends into a lighted space above the persistently shadowed region;
supporting at least one reflector in the self-erecting tower in the lighted space and positioning the at least one reflector to direct light energy onto a floor of the region persistently shadowed by the at least one topological feature, thereby providing a first form of energy;
positioning the at least one reflector over time such that the at least one reflector consistently redirects sunlight to at least one conversion location disposed on the floor of the shadowed region;
providing, at the at least one conversion location on the floor of the shadowed region, one or more solar energy converters; and
converting the received sunlight into electrical energy at the one or more solar energy converters, thereby providing a second form of energy,
wherein the tower is substantially transparent to the sunlight reflected from the at least one reflector passing through the tower,
wherein the tower is a lightweight tensegrity structure placed on the floor of the shadowed region and extends above an altitude of the at least one topological feature into a region of substantially continuous sun illumination,
the at least one reflector comprises a heliostat placed at or near a top of the tower, the heliostat configured to be actuated to slowly rotate in order to track an apparent position of the sun,
wherein the heliostat is supported by a rigid circumferential torus, the surface of the torus is configured to cause the sunlight which strikes the torus to be reflected or scattered across the shadowed region thus providing low-intensity area illumination thereof, and
wherein a radio frequency reflecting mirror is placed below the heliostat at or near the top of the tower, the radio frequency mirror substantially non-occluding to the sunlight.

9. A system for providing at least two forms of energy to a region persistently shadowed by at least one topological feature, the system comprising:
a self-erecting tower positioned in a region persistently shadowed by the at least one topological feature such that the tower extends into a lighted space above the persistently shadowed region;
at least one reflector supported in the self-erecting tower in the lighted space and positioned to direct light energy onto a floor of the region persistently shadowed by the at least one topological feature, thereby providing a first form of energy, wherein the at least one reflector is configured to be positioned over time such that the at least one reflector consistently redirects sunlight to at least one conversion location disposed on the floor of the shadowed region;
one or more solar energy converters positioned at the at least one conversion location on the floor of the shadowed region, the one or more solar energy converters configured to convert the received sunlight into electrical energy, thereby providing a second form of energy;
a first radio frequency transceiver configured to permit two-way communication with Earth; and
a second radio frequency transceiver on or near the tower configured to send or receive signals to other locations within the lunar polar region,
wherein the tower is substantially transparent to the sunlight reflected from the at least one reflector passing through the tower.

10. The system of claim 9, wherein:
the tower is a lightweight tensegrity structure placed on the floor of the shadowed region and extends above an altitude of the at least one topological feature into a region of substantially continuous sun illumination, and
the at least one reflector comprises a heliostat placed at or near a top of the tower, the heliostat configured to be actuated to slowly rotate in order to track an apparent position of the sun.

11. The system of claim 10, wherein:
the self-erecting tower is positioned in a crater in a lunar polar region; and
the heliostat is further configured to extend upwardly to avoid a shadow of a rim of the crater and reflect energy propagated from the apparent position of the sun during the monthly rotational period of the Moon.

12. The system of claim 10, wherein the heliostat comprises a thin film heliostat weighing less than one third the weight of the tower.

13. The system of claim 9,
wherein the tower is substantially transparent or non-occluding to the sunlight reflected from the at least one reflector,
wherein the shadowed region comprises a permanently shadowed surface region of a celestial body that is not illuminated when sunlight illuminates the at least one reflector.

14. The system of claim 13, wherein the tower is between 500 and 1000 meters tall having at least one foot at its base that is positioned in the permanently-shadowed surface region and configured to support the at least one reflector and position the at least one reflector in an upper, less shadowed portion of the tower to receive sunlight.

15. A system for providing at least two forms of energy to a region persistently shadowed by at least one topological feature, the system comprising:
a self-erecting tower positioned in a region persistently shadowed by the at least one topological feature such that the tower extends into a lighted space above the persistently shadowed region;
at least one reflector supported in the self-erecting tower in the lighted space and positioned to direct light energy onto a floor of the region persistently shadowed by the at least one topological feature, thereby providing a first form of energy, wherein the at least one reflector is configured to be positioned over time such that the at least one reflector consistently redirects sunlight to at least one conversion location disposed on the floor of the shadowed region, wherein the at least one reflector comprises a heliostat placed at or near a top of the tower, the heliostat configured to be actuated to slowly rotate in order to track an apparent position of the sun;
one or more solar energy converters positioned at the at least one conversion location on the floor of the shadowed region, the one or more solar energy converters configured to convert the received sunlight into electrical energy, thereby providing a second form of energy;

a rigid circumferential torus configured to support the heliostat, the surface of the torus is further configured to cause the sunlight which strikes the torus to be reflected or scattered across the shadowed region thus providing low-intensity area illumination thereof; and a radio frequency reflecting mirror placed below the heliostat at or near the top of the tower, the radio frequency mirror substantially non-occluding to the sunlight, wherein the tower is substantially transparent to the sunlight reflected from the at least one reflector passing through the tower, and wherein the tower is a lightweight tensegrity structure placed on the floor of the shadowed region and extends above an altitude of the at least one topological feature into a region of substantially continuous sun illumination.

16. A tower for providing at least two forms of energy to a region persistently shadowed by at least one topological feature, the tower comprising:

a self-erecting tower positioned in a region persistently shadowed by the at least one topological feature such that the tower extends into a lighted space above the persistently shadowed region;

at least one reflector supported in the self-erecting tower in the lighted space and positioned to direct light energy onto a floor of the region persistently shadowed by the at least one topological feature, thereby providing a first form of energy, wherein the at least one reflector is configured to be positioned over time such that the at least one reflector consistently redirects sunlight to at least one conversion location disposed on the floor of the shadowed region;

a first radio frequency transceiver configured to permit two-way communication with Earth; and a second radio frequency transceiver on or near the tower configured to send or receive signals to other locations within the lunar polar region, wherein the at least one reflector is further configured to direct the light energy to one or more solar energy converters positioned at the at least one conversion location on the floor of the shadowed region, the one or more solar energy converters configured to convert the received sunlight into electrical energy, thereby providing a second form of energy, and wherein the tower is substantially transparent to the sunlight reflected from the at least one reflector passing through the tower.

17. The tower of claim 16, wherein:

the tower is a lightweight tensegrity structure placed on the floor of the shadowed region and extends above an altitude of the at least one topological feature into a region of substantially continuous sun illumination, and the at least one reflector comprises a heliostat placed at or near a top of the tower, the heliostat configured to be actuated to slowly rotate in order to track an apparent position of the sun.

18. The tower of claim 17, further comprising:

a rigid circumferential torus configured to support the heliostat, the surface of the torus is further configured to cause the sunlight which strikes the torus to be reflected or scattered across the shadowed region thus providing low-intensity area illumination thereof; and a radio frequency reflecting mirror placed below the heliostat at or near the top of the tower, the radio frequency mirror substantially non-occluding to the sunlight.

19. The tower of claim 17, wherein:

the self-erecting tower is positioned in a crater in a lunar polar region; and the heliostat is further configured to extend upwardly to avoid a shadow of a rim of the crater and reflect energy propagated from the apparent position of the sun during the monthly rotational period of the Moon.

\* \* \* \* \*